(12) United States Patent
Liu (10) Patent No.: US 6,380,062 B1
(45) Date of Patent: Apr. 30, 2002

(54) METHOD OF FABRICATING SEMICONDUCTOR PACKAGE HAVING METAL PEG LEADS AND CONNECTED BY TRACE LINES

(75) Inventor: Wen-Chun Liu, Kaohsiung (TW)

(73) Assignee: Walsin Advanced Electronics Ltd., Kaohsiung (TW)

( * ) Notice: Subject to any disclaimer, the term of this patent is extended or adjusted under 35 U.S.C. 154(b) by 0 days.

(21) Appl. No.: 09/802,796

(22) Filed: Mar. 9, 2001

(51) Int. Cl.[7] .............................................. H01L 21/44
(52) U.S. Cl. .................... 438/613; 29/831; 174/263; 257/666; 257/678; 257/738; 438/15; 438/106; 438/112; 438/121; 438/124; 438/612
(58) Field of Search .................... 29/831; 174/263; 257/666, 676, 678, 692, 693, 697, 701, 707, 736, 738, 739, 775; 438/14, 15, 106, 107, 110–113, 121–127, 612–617; 228/180.22

(56) References Cited

U.S. PATENT DOCUMENTS 5,977,633 A  * 11/1999 Suzuki et al. ................ 257/758

6,201,292 B1 * 3/2001 Yagi et al. .................... 257/666

* cited by examiner

*Primary Examiner*—Chandra Chaudhari
*Assistant Examiner*—Asok Kumar Sarkar
(74) *Attorney, Agent, or Firm*—J.C. Patents (57) ABSTRACT

A method for forming ball grid array package. The ball grid array package has internal trace lines and exposed metal pegs. A metal substrate is provided. Electroplated layers are formed over metal peg regions and a die pad region on the surface of the metal substrate. A layer of substrate material at the top surface of the metal substrate is removed so that thickness of the metal substrate is reduced. Hence, trace lines, die pad and internal metal pegs are formed. A die is attached to the die pad and electrical connections from the die to the internal metal pegs are made. A molding process is carried out to enclose the die, the die pad and the internal metal pegs on one side of the metal substrate with plastic material. The lower surface of the metal substrate is etched to form external metal pegs while exposing the mold material and the bottom surface of the die pad. The internal metal pegs and the external metal pegs are interconnected via the trace lines. A soldering mask layer is formed over the package surface covering the trace lines but exposing the electroplated at the end face of each external metal peg.

18 Claims, 7 Drawing Sheets

METHOD OF FABRICATING SEMICONDUCTOR PACKAGE HAVING METAL PEG LEADS AND CONNECTED BY TRACE LINES

BACKGROUND OF THE INVENTION

1. Field of Invention

The present invention relates to a method of manufacturing semiconductor package. More particularly, the present invention relates to a method of manufacturing a ball grid array package with metal peg leads, all connected by trace lines.

2. Description of Related Art

In the semiconductor production industry, the manufacturing of integrated circuits (ICs) is generally divided into three distinct stages. In the first stage, the semiconductor substrates or silicon wafers are formed using an epitaxial technique. In the second stage, various semiconductor devices such as MOS transistors and multi-level interconnects are formed in the semiconductor substrate by various operations. In the third and last stage, the silicon wafers are diced up to form individual dies followed by enclosing the die with suitable material to form a package. The package not only protects the die from mechanical damage, but also provides a medium for electrically connecting the die to other electronic components on a printed circuit board.

In general, an IC module must have a large number of electrical outlets because there are a large number of contacts on a die that needs to be connected. Consequently, hundreds of conductive lines are needed inside the package. In a conventional package, a lead frame is used to connect bonding pads on a die with external contact points outside the package. However, due to the rapid increase in the level of integration for integrated circuits without a corresponding increase in size of the package, the conventional lead frame is simply incapable of providing the necessary number of wiring connections. In addition, electronic products are becoming lighter and smaller all the time due to fierce competition in the marketplace. These market forces provide an impetus for the rapid development of new types of packaging techniques such as chip scale package, chip size package and multi-chip module.

Nowadays, techniques for manufacturing integrated circuits having a line width smaller than 0.18 micron are available. With many breakthroughs in the level of circuit integration, the size of a package has reduced considerably.

A conventional package uses a lead frame as a die carrier with leads protruding from the side of the package. Because these leads are distributed around the periphery of the package, the package must occupy a larger area. Furthermore, the high pin count limits the pitch between leads. In other words, there is a limit to possible package reduction. Consequently, area array package designs are introduced. The contact points of an area array package are usually laid on the bottom surface of the package. Ball grid array (BGA), small outline no-lead (SON) and ball chip carrier (BCC), for example, are all area array packages.

Figure 1A:
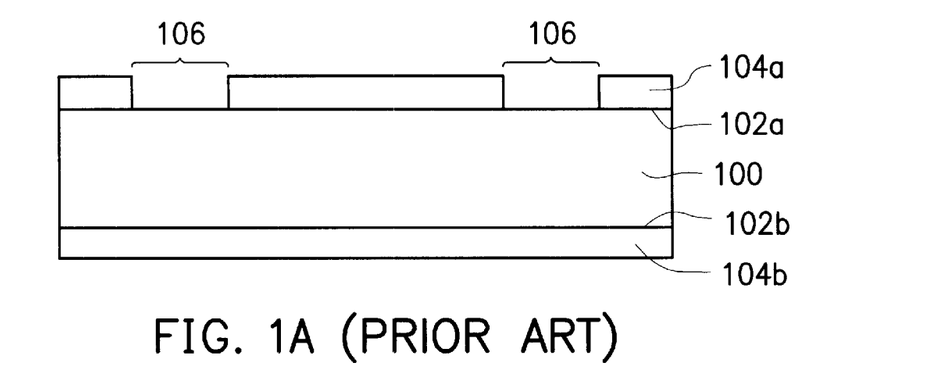
FIGS. 1A through 1E are schematic, cross-sectional views showing the progression of manufacturing steps for fabricating a conventional ball chip carrier package.

FIGS. 1A through 1E are schematic, cross-sectional views showing the progression of manufacturing steps for fabricating a conventional ball chip carrier package. As shown in FIG. 1A, photoresist material is deposited over surfaces 102a and 102b of a copper substrate 100 to form photoresist layers 104a and 104b, respectively. The photoresist layer 104a is exposed and developed to form ball lead areas 106 that expose a top surface 102a of the copper substrate 100.

Figure 1B:
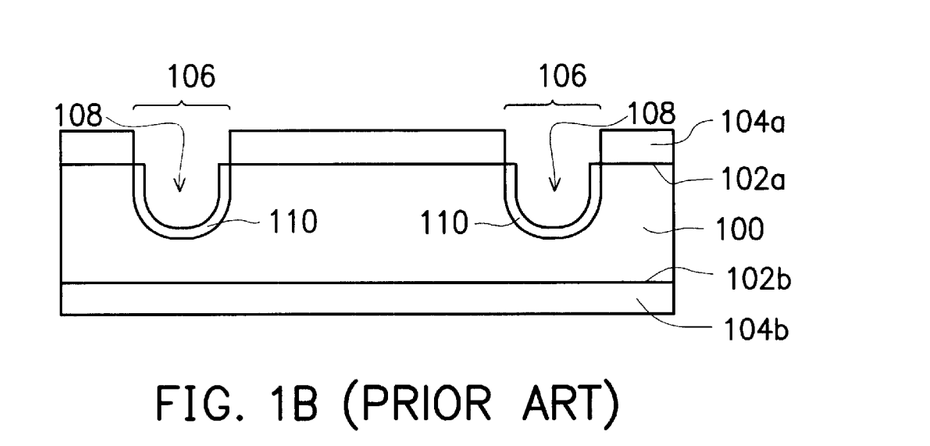

As shown in FIG. 1B, a wet etching operation is conducted to etch the copper substrate 100 with the photoresist layers 104a and 104b serving as a mask, thereby forming hemispherical cavities 108 in the ball lead areas 106. An electroplating operation is carried out to form a conformal layer of metallic film 110 over the hemispherical cavities 108.

Figure 1C:
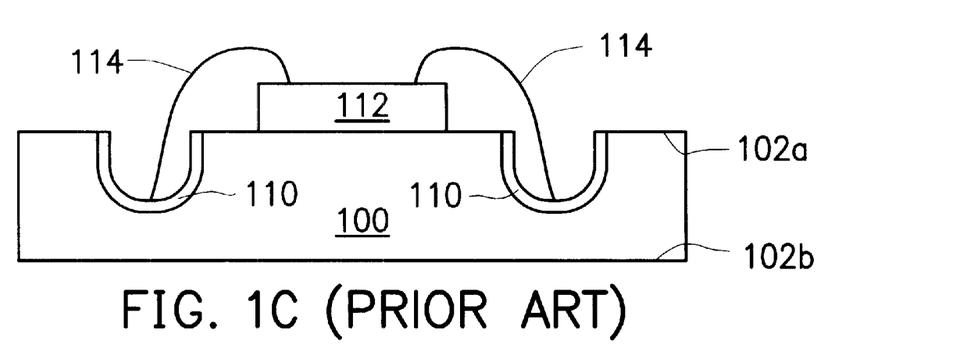
Figure 1D:
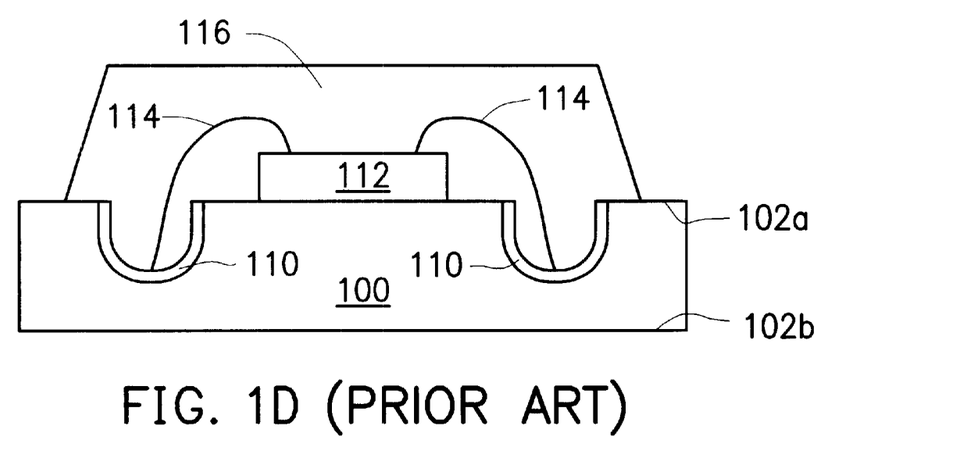

As shown in FIG. 1C, both photoresist layers 104a and 104b are removed, and a die 112 is attached to the surface 102a. A wire-bonding step is carried out to form metallic wires 114 to link bonding pads (not shown in the figure) on the die 112 with the metallic film 110. The upper surface 102a of the copper substrate 100 is sealed off using plastic material such as resin 116 as shown in FIG. 1D. The resin 116 encloses the die 112, the metallic wires 114 and the metallic film 110 inside the cavity 108.

Figure 1E:
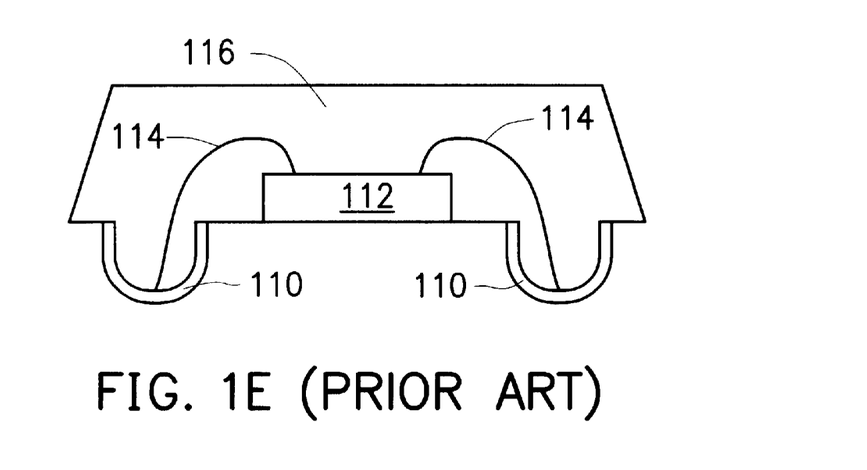

As shown in FIG. 1E, another wet etching operation is performed to remove the copper substrate 100 (portions labeled 100 in FIG. 1D). Ultimately, the hemispherical metal films 110, the bottom portion of the die 112 and the surface of resin 116 are all exposed to form a complete ball chip carrier package. This type of package utilizes the hemispherical metallic films 110 as leads for connecting with external circuits.

However, the aforementioned package has a potential reliability problem as well as a production yield problem. A metallic film is used to line each lead cavity. Since the metal film is made from precious metal, thickness of the metallic film should be minimized as much as possible. Yet, saving precious metal by forming a thin metallic film makes the film vulnerable to scratches or peelings during transition or transfer. Too much damage to the metallic film may result in bad connections with a printed circuit board and may also lead to reliability problems when the package is finally mounted onto a PCB using surface mount technology (SMT). Consequently, product yield will deteriorate.

Furthermore, as the pin count of each device continues to increase, density of bonding pads on a package board must increase correspondingly. In other words, distance of separation between neighboring bonding pads is shortened. The number of contact points on the package board for connecting with a PCB must correspond to the number of bonding pads on a die. However, the ultimate size and distance of separation of each contact point from its neighbor is restricted by the area available on the package board. Hence, only a contact layout array type is able to accommodate a sufficiently large number of contact points.

SUMMARY OF THE INVENTION

Accordingly, the invention provides a method for forming a ball grid array package with trace lines and metal pegs so that the package has a better overall reliability and a higher produce yield. The metal pegs serve as external leads of the package. The metal pegs are arranged to form an array. Molding material is formed only on one side of an internal substrate board, and hence a thinner package is obtained. Furthermore, a bottom surface of the package is exposed for dissipating more heat away from an internal die. In addition, the end surface of each metal peg has an electroplated layer. This electroplated layer confers good bondability, molding characteristics and solderability to the metal pegs so that subsequent soldering processes are easier to conduct. In brief, the package is suitable for housing a high pin count device.

To achieve these and other advantages and in accordance with the purpose of the invention, as embodied and broadly described herein, the invention provides a method for forming ball grid array package. The ball grid array package has internal trace lines and exposed metal pegs suitable for forming a high pin count device. A metal substrate is provided. Electroplated layers are formed over metal peg regions and a die pad region on the surface of the metal substrate. A layer of substrate material at the top surface of the metal substrate is removed by etching so that thickness of the metal substrate is reduced. Hence, trace lines, die pad and internal metal pegs are formed. A die is attached to the die pad and electrical connections from the die to the internal metal pegs are made. A molding process is carried out to enclose the die, the die pad and the internal metal pegs on one side of the metal substrate using plastic material. The lower surface of the metal substrate is etched to form external metal pegs while exposing the mold material and the bottom surface of the die pad. The internal metal pegs and the external metal pegs are interconnected via the trace lines. A soldering mask layer is formed over the package surface covering the trace lines but exposing the electroplating at the end face of each external metal peg.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are schematic, cross-sectional views showing the progression of manufacturing steps in fabricating a ball grid array package having patterned trace lines and an array of metal pegs within according to the preferred embodiment of this invention.

Figure 2A:
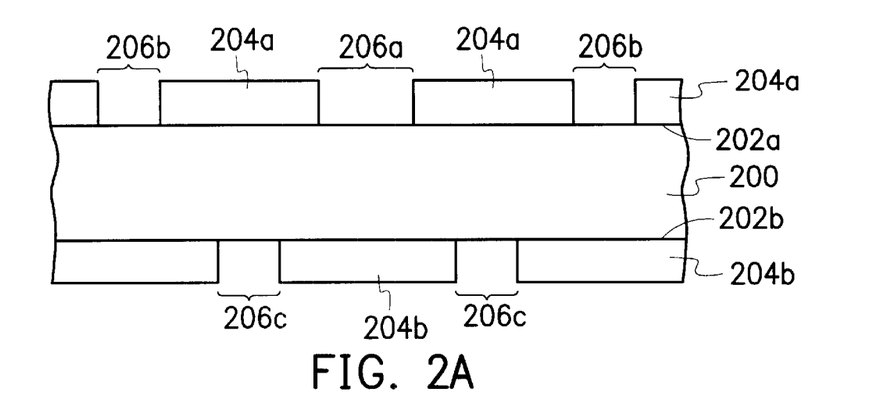
FIGS. 2A through 2H are schematic, cross-sectional views showing the progression of manufacturing steps for fabricating a ball grid array package having patterned trace lines and an array of metal pegs within according to the preferred embodiment of this invention.

As shown in FIG. 2A, a metal substrate 200 is provided. The metal substrate 200 can be made from a metallic material including copper, iron, copper alloy (C151, C194, C7025, KCF125 or EFTEC) or nickel-iron alloy (Ni—Fe 42 alloy). Photoresist is deposited over a first surface 202a and a second surface 202b of the metal substrate 200. The photoresist layers are exposed and developed to form a patterned first photoresist layer 204a on the first surface 202a and a patterned second photoresist layer 204b on the second surface 202b. After the photolithographic operation, a die pad region 206a, first metal peg regions 206b and second metal peg regions 206c are formed.

Figure 2B:
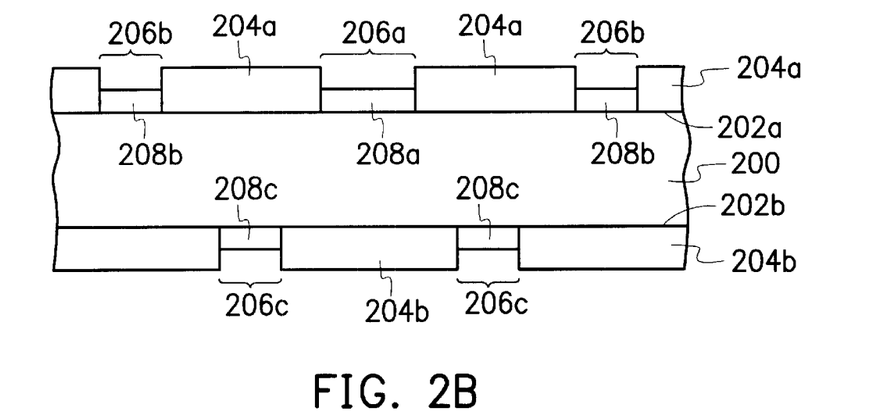

As shown in FIG. 2B, electroplating is carried out to form a die pad electroplated layer 208a over the die pad region 206a, a first electroplated layer 208b over each first metal peg region 206b, and a second electroplated layer 208c over each second metal peg region 206c. The die pad electroplated layer 208a, the first electroplated layer 208b and the second electroplated layer 208c are formed by plating a metal selected from a list that includes gold (Au), silver (Ag), nickel (Ni), palladium (Pd), nickel-palladium alloy (Ni—Pd alloy), or various combinations of the metals in the above list. The electroplated layer is preferably formed by plating in sequence a nickel layer, a nickel-palladium layer and a palladium layer. The nickel layer at the bottom is used as a protective layer against corrosion. The top palladium layer has good bondability, molding compound characteristic and solderability that can improve the quality of subsequently formed bonding pads.

Figure 3A:
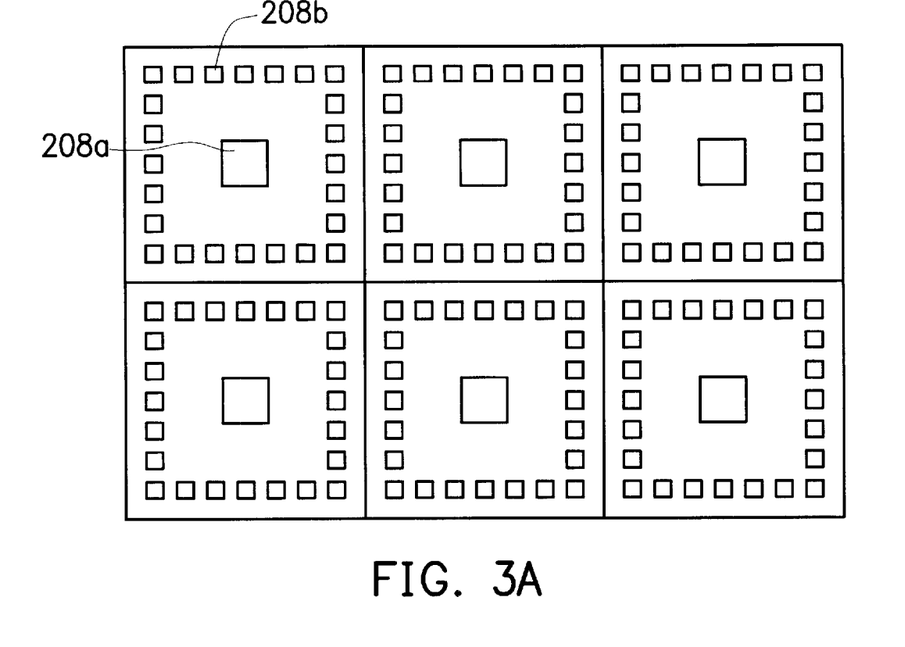
FIGS. 3A and 3B are the respective top and bottom schematic views of the metal substrate after the formation of an electroplated layer according to the method of this invention.
Figure 3B:
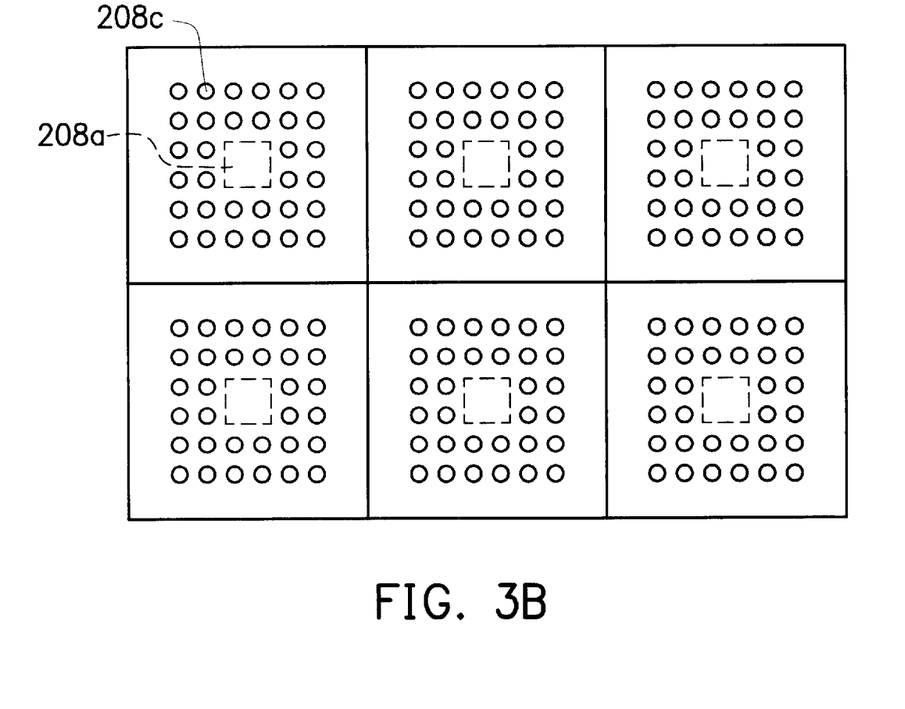

FIGS. 3A and 3B are the respective top and bottom schematic views of the metal substrate after the formation of an electroplated layer according to the method of this invention. As shown in FIGS. 3A and 3B, the metal substrate of several packages metal substrates can be processes simultaneously. The metal substrate shown in FIG. 3A is similar to viewing the first surface 202a from the top of FIG. 2B. The die pad electroplated layer 208a is formed at the center, right above the die pad region 206a. The first electroplated layers 208b are positioned around the die pad region 206a near the edges of the metal substrate 200. The remaining substrate board surface is covered by the photoresist layer 204a. The metal substrate as shown in FIG. 3B is similar to viewing the second surface 202b from the bottom in FIG. 2B. The second electroplated layers 208c forms an area array distribution with the photoresist layer 204b covering the remaining surface of the metal substrate 200.

In this embodiment of the invention, the die pad electroplated layer 208a and the first electroplated layers 208b as shown in FIG. 3A have a rectangular shape. The second electroplated layer 208c as shown in FIG. 3B has a circular shape. However, the die pad electroplated layer 208a, the first electroplated layer 208b and the second electroplated layer 208c can be formed in any geometric shapes. In addition, the first electroplated layers 208b and the second electroplated layers 208c can be distributed on the metal substrate 200 in whatever configurations are suitable according to the number of pads and contact points required. For example, the electroplated layers can be positioned around the center in a single loop (such as the configuration in FIG. 3A). Alternatively, the electroplated layers can form multiple loops around the center (such as the configuration in FIG. 3B). Therefore, the configurations shown in FIGS. 3A and 3B serve as an illustration only, and should not be used to limit the scope of the invention.

Figure 2C:
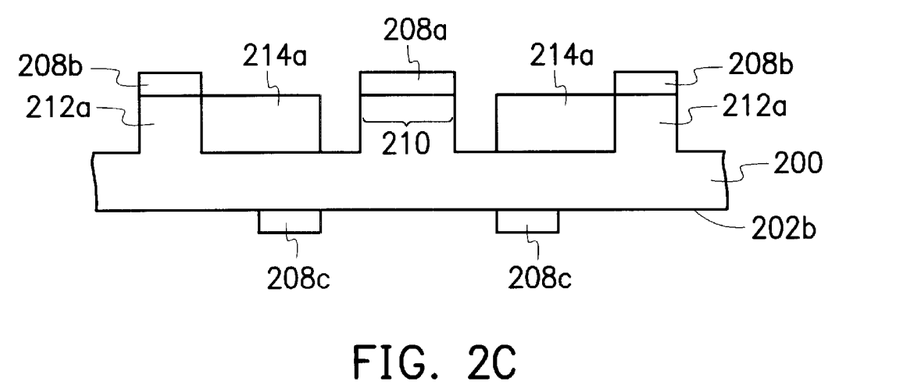

As shown in FIG. 2C, the first photoresist layer 204a and the second photoresist layer 204b are removed. Another photoresist layer (not shown in the figure) is formed on the first surface 202a of the metal substrate 200. A photolithographic method is used to pattern the photoresist layer. Using the patterned photoresist layer as a mask, the metal substrate 200 is etched to form a die pad 210, a first metal peg 212a and trace lines 214a. A wet etching method, for example, can be used to remove the substrate material. The trace lines 214a are separated from the die pad 210 by a distance so that the surrounding region of the die pad 210 forms an isolation region. Hence, unnecessary electrical connection between the die and the trace lines 214a is prevented. Furthermore, the die pad 210 is covered by the die pad electroplated layer 208a, and all first metal pegs 212a are covered by first electroplated layer 208b. The trace lines 214a are conductive lines that connect various metal pegs to their corresponding contact points.

Figure 2D:
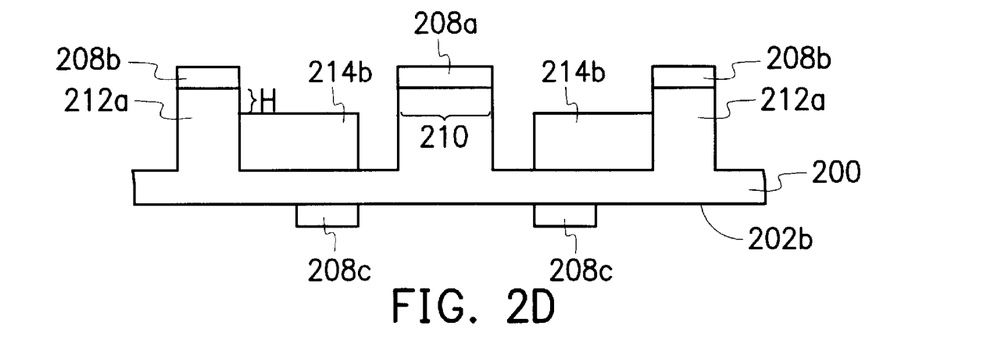

As shown in FIG. 2D, the height of various trace lines 214a is reduced in a thickness-reduction operation. In carrying out the thickness reduction, a top layer of substrate material not covered by the electroplated die pad layer 208a and the first electroplated layer 208b is removed. Ultimately, trace lines 214b, die pad 210 and first metal pegs 212a that surround the die pad 210 are formed. There is a height difference H from a top surface of the first metal peg 212a to a top surface of the trace lines 214b. The height difference H is at least about 1 mil or about 0.025 mm. Preferably, the height difference is greater than about 2 mil or about 0.05 mm. Substrate thickness can be reduced by carrying out a half-etching operation using the electroplated die pad layer 208a and the first electroplated layers 208b as an etching mask, for example. Alternatively, thickness of areas not covered by the electroplated die pad layer 208a or the first electroplated layer 208b is reduced by stamping with a stamping mold.

Figure 4:
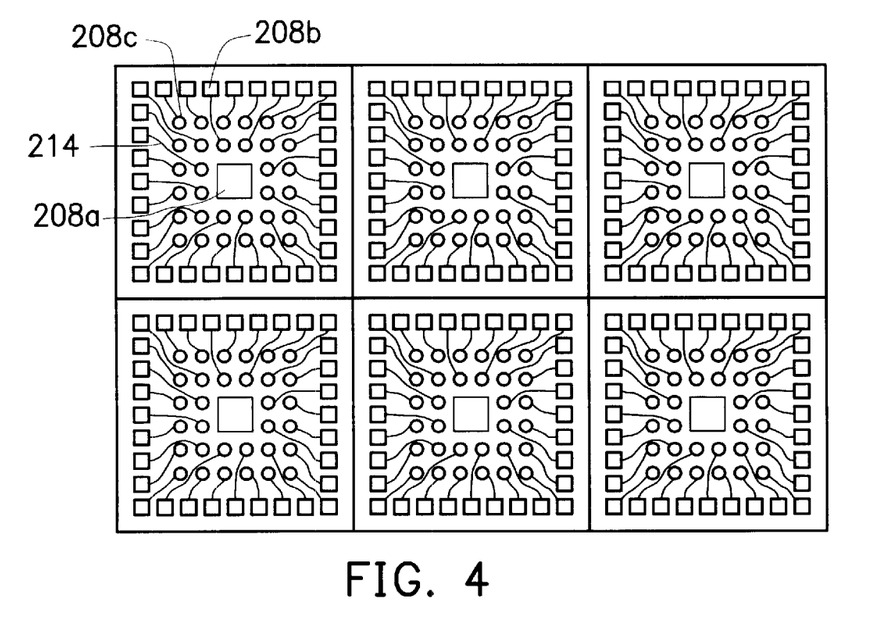
FIG. 4 is a bottom schematic view of the metal substrate after trace lines are formed according to the method of forming the package of this invention.

FIG. 4 is a bottom view of the metal substrate after trace lines are formed according to the method of forming the package of this invention. The metal substrate 200 shown in FIG. 4 is similar to viewing the first surface 202a from the top of FIG. 2C or FIG. 2D. The electroplated die pad layer 208a is located at the center of the die packaging are a. Each trace line 214 serves as a medium for linking from one of the first electroplated layers 208b to one of the second electroplated layers 208c.

Figure 2E:
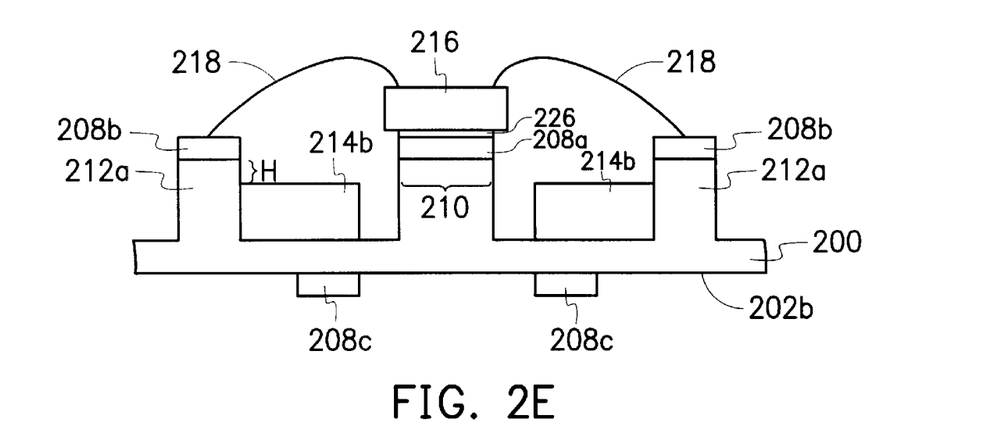

As shown in FIG. 2E, a die 216 is attached to the electroplated layer 208a above the die pad region 210 using adhesive material 226 such as insulation plastic, silver paste or attachment tape. Conductive wires 218 that connect die pads on the die 216 (not shown in the figure) with the first electroplated layers 208b above the first metal pegs 212a are formed in a wire-bonding machine. The conductive wires 218, for example, can be gold, aluminum or copper wires.

Figure 5:
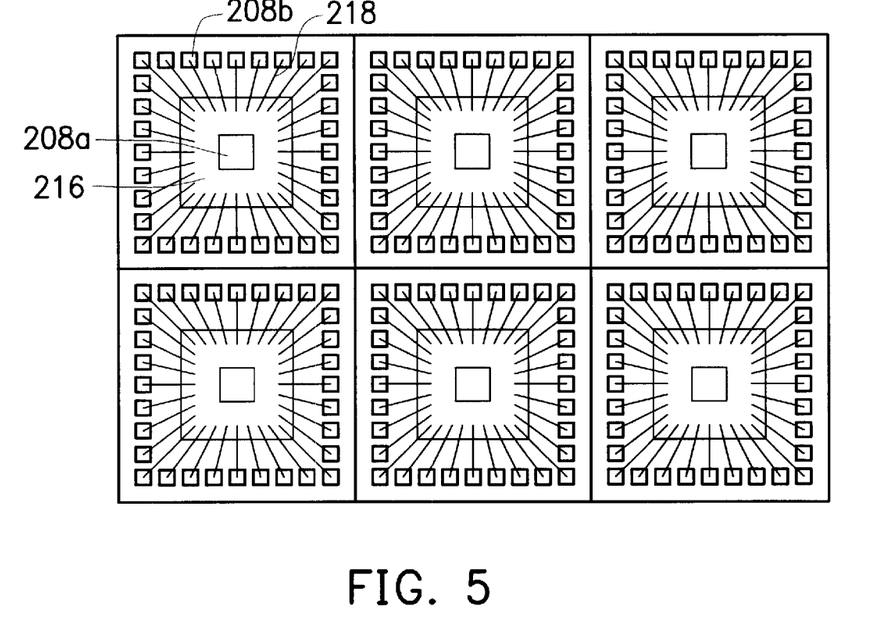
FIG. 5 is a top view of the metal substrate after a die is attached to the substrate and the necessary wires are bonded according to the method of forming the package of this invention.

FIG. 5 is a top view of the metal substrate after a die is attached to the substrate and the necessary wires are bonded according to the method of forming the package of this invention. As shown in FIG. 5, the die 216 occupies an area larger than the electroplated die pad layer 208a. Electrical connection between the die pads and the first electroplated layer 208b is achieved by laying down conductive wires 218 using a wire-bonding machine. Gold, aluminum and copper are all admissible material for forming the conductive wires 218.

As shown in FIGS. 4 and 5, the first electroplated layers 208b are distributed around the die near the edges of the metal substrate. In practice, the distribution of the first electroplated layer 208b should reflect the distribution of the die pads. Hence, the distribution of the first electroplated layers in FIGS. 4 and 5 should be regarded as a reference only. It is also possible to place the first electroplated layers on two sides of the die or in some other configuration.

Figure 2F:
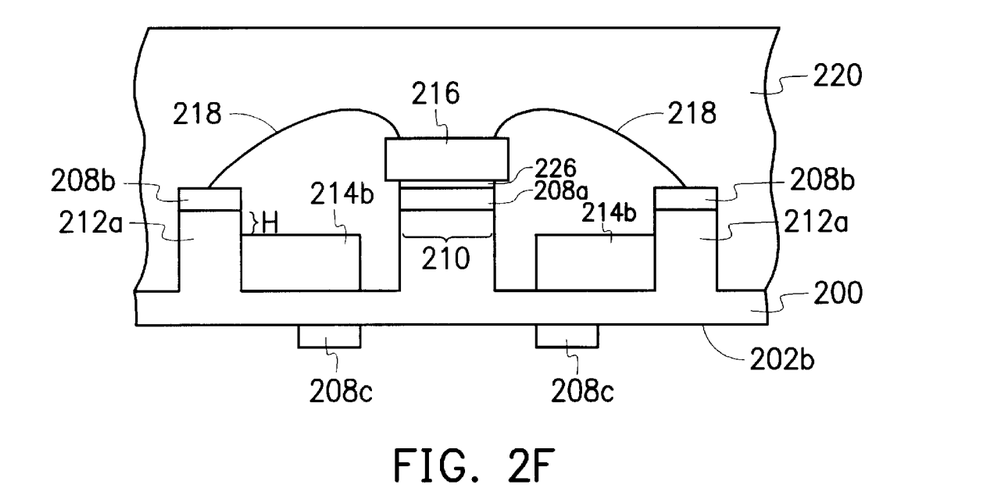

As shown in FIG. 2F, a molding process is conducted using insulation material 220. The conductive wires 218, the die 216, the electroplated die pad layer 208a, the die pad 210, the first electroplated layer 208b, the first metal peg 212a and the trace lines 214b are all enclosed. The insulation material includes resin and epoxy resin. The molding step is carried to form an enclosure over only the first surface 202a of the metal substrate. Hence, the second surface 202b of the metal substrate 200 is exposed.

Figure 2G:
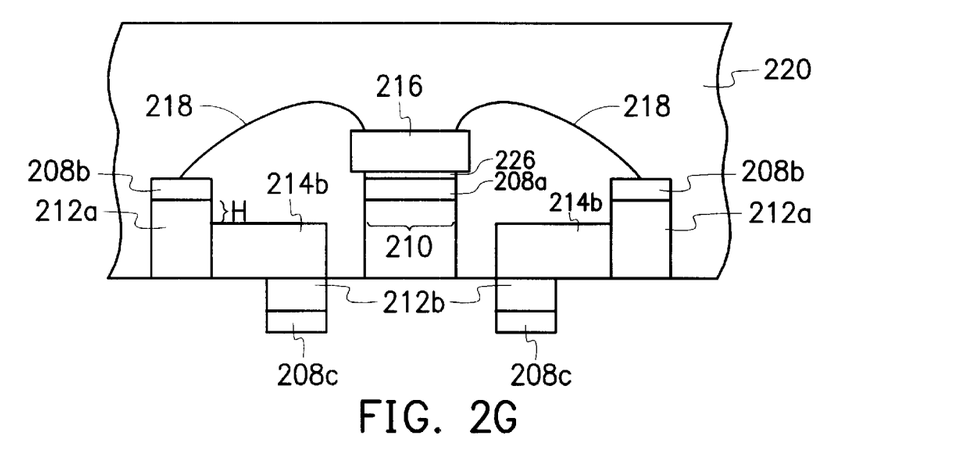

As shown in 2G, using the second electroplated layer 208c as an etching mask, the exposed surface (surface 202b in FIG. 2F) of the metal substrate 200 is etched to remove a portion of the substrate material. The layer of insulation material 220 and trace lines 214b are exposed, forming second metal pegs 212b. At this point, processes for forming the trace lines and metal pegs are complete. After the etching step, the die pad 210 has a surface parallel to the lower surface of the insulation layer 220. The second metal pegs 212b are electrically connected to corresponding first metal pegs through the trace lines 214b.

Figure 2H:
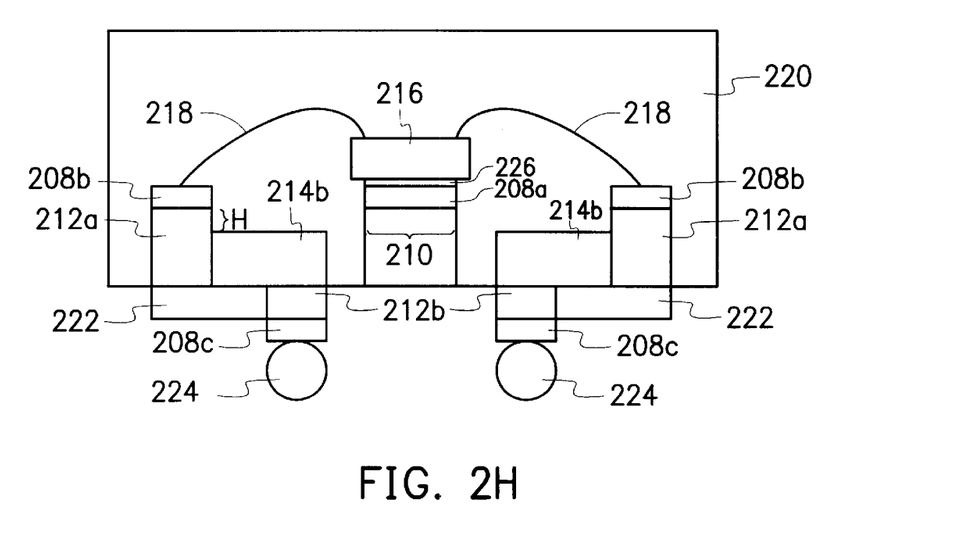

As shown in FIG. 2H, soldering mask material is deposited over the package surface to form a soldering mask 222 that exposes the second electroplated layer 208c on the surface of the trace lines 214b. The soldering mask 222 only covers the exposed surface of the trace lines 214b. However, the soldering mask 222 can cover other areas besides the trace lines 214b, as long as the second electroplated layers 208c are exposed. The soldering mask 222 is formed using an insulation material such as an ultraviolet sensitive compound or a bake-hardening compound. The soldering mask 222 can be formed using, for example, a roller coating method, a curtain coating method, a screen printing method or a dry film method. For example, the formation of the soldering mask 222 using ultraviolet sensitive compound involves coating a layer of the compound onto the surface of the die package covering the exposed trace lines 214b. After a first baking, exposure and development, a second baking is carried out to form the desired soldering mask 222. On the other hand, if a bake-hardening compound is used, the compound is deposited onto the exposed surface of the trace lines 214b according to a soldering mask pattern. After a bake-hardening step, the required soldering mask 222 is formed.

After the production of the soldering mask 222, bonding material 224 can be implanted over the second electroplated layers 208c at the bottom surface of the package. Bonding material 224 provides a medium for electrically connecting the die package to a printed circuit board. The bonding material 224 can be, for example, solder paste, or alternatively solder balls or copper balls. If the solder or copper balls are attached to the second electroplated layers 208c, a ball grid array (BGA) is formed. If solder paste is applied to the surface of the second electroplated layers 208c, a land grid array (LGA) is formed. The final step is to dice up the wafer to form individual packages.

The ball grid array package of this invention as shown in FIG. 2H includes a die pad 210 whose top surface is coated with an electroplated layer 208a and whose bottom surface is exposed. The die pad 210 is used for carrying the die 216. The second metal pegs 212b are distributed around the die pad 210 near the edges of the package forming an area array layout. Each first metal peg 212a has one end embedded inside the packaging material 220, and is electrically connected to a bonding pad on the die 216. The other end of the first metal peg 212a is connected to a trace line 214b so that the first metal peg 212a is electrically connected to one of the second metal pegs 212b. In addition, the end faces of each first metal peg 212a and each second metal peg 212b are covered by first electroplated layer 208b and second electroplated layer 208c, respectively. These electroplated layers provide a medium that facilitates bonding with other material.

In summary, the advantages of the invention at least include:

1. The ball grid array package utilizes a series of metal pegs at the bottom as leads for connecting an internal die with an external circuit. The metal pegs are laid out in the form of an area array, thereby increasing the level of integration of the package. Since a metal peg has higher mechanical strength and reliability the quality of the package is greatly improved.

2. Since only one side of the package is enclosed, a smaller package thickness is obtained. Furthermore, the bottom surface of the die pad is exposed, and more heat can be dissipated from the die.

3. An electroplated layer is formed over the end surface of each metal peg. This electroplated layer serves as an etching mask during an etching process. In addition, bondability, molding characteristics and solderability of the metal pegs can be improved if electroplate material is carefully selected to form the electroplated layer. Hence, reliable bonding surfaces are obtained.

4. Solder or copper balls can be attached to each exposed metal peg surface to form a ball grid array so that electrical connections with a printed circuit board can be made. In addition, solder paste can be smeared over the exposed metal peg surfaces to form a land grid array, which can be similarly connected to an external printed circuit board.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a ball grid array package, comprising the steps of:

providing a metal substrate having a first and a second surface;

forming an electroplated die pad layer and a plurality of first electroplated layer over the first surface of the metal substrate such that the first electroplated layers are positioned around the central electroplated die pad layer;

forming a plurality of second electroplated layers over the second surface of the metal substrate;

performing a patterning operation to remove a layer of substrate material from the first surface to form a die pad under the electroplated die pad layer, a plurality of first metal pegs under the first electroplated layers, and a plurality of trace lines in the metal substrate;

performing an etching operation to reduce thickness of the trace lines so that a top surface of the trace line is at a height lower than a top surface of the first metal peg;

attaching a die onto the electroplated die pad layer;

forming electrical connections between the die and the first electroplated layers;

enclosing the die, the electroplated die pad layer, the die pad, the trace lines, the first electroplated layer and the first metal pegs on the first surface of the metal substrate using an insulation material;

etching the second surface of the metal substrate to form a plurality of second metal pegs using the second electroplated layers as an etching mask so that a portion of the trace lines is exposed; and forming a soldering mask over the second surface of the metal substrate such that the second electroplated layers are exposed.

2. The method of claim 1, wherein the steps of forming the electroplated die pad layer, the first electroplated layers and the second electroplated layers further includes the sub-steps of:

forming a first photoresist layer over the first surface of the metal substrate and forming a second photoresist layer over the second surface of the metal substrate;

performing a photolithographic operation to expose the first photoresist layer and the second photoresist layer to light;

developing the first photoresist layer and the second photoresist layer to pattern the die pad region and the plurality of first metal peg regions on the first surface of the metal substrate, and the plurality of second metal peg regions on the second surface of the metal substrate; and performing an electroplating operation to form an electroplated die pad layer over the die pad region, a first electroplated layer over each first metal peg region and a second electroplated layer over each second metal peg region.

3. The method of claim 1, wherein the step of forming the electroplated die pad layer includes plating metal selected from a group that includes gold, silver, nickel, palladium and a combination of the metals from the above list.

4. The method of claim 1, wherein the step of forming the first electroplated layers includes plating metal selected from a group that includes gold, silver, nickel, palladium and a combination of the metals from the above list.

5. The method of claim 1, wherein the step of forming the second electroplated layers includes plating metal selected from a group that includes gold, silver, nickel, palladium and a combination of the metals from the above list.

6. The method of claim 1, wherein the step of patterning the metal substrate to form the die pad, the first metal pegs and the trace lines includes performing a photolithographic and an etching operation.

7. The method of claim 1, wherein the step of reducing the thickness of the trace lines includes etching the first surface of the metal substrate using the electroplated die pad layer and the first electroplated layer as an etching mask.

8. The method of claim 1, wherein the step of reducing the thickness of the trace lines includes pressing the area not covered by any electroplated die pad layer or first electroplated layers with a pre-formed mold.

9. The method of claim 1, wherein the difference in height from the top surface of the trace line to the top surface of the first metal peg is at least about 1 mil.

10. The method of claim 1, wherein the step of attaching the die onto the electroplated die pad layer includes applying some glue.

11. The method of claim 1, wherein the step of connecting the die with the first electroplated layers includes conducting wire bonding to form a plurality of conductive wires linking the first electroplated layers to the die.

12. The method of claim 11, wherein the material for forming the conductive wires is selected from the group consisting of gold, aluminum and copper.

13. The method of claim 1, wherein the step of forming the soldering mask includes a screen printing method.

14. The method of claim 1, wherein the step of forming the soldering mask includes depositing a bake-hardened compound.

15. The method of claim 1, wherein the step of forming the soldering mask includes depositing an ultraviolet-sensitive compound.

16. The method of claim 1, wherein after the step of forming the soldering mask, further includes attaching a solder ball onto the exposed surface of each second electroplated layer.

17. The method of claim 1, wherein after the step of forming the soldering mask, further includes attaching a copper ball onto the exposed surface of each second electroplated layer.

18. The method of claim 1, wherein after the step of forming the soldering mask, further includes smearing solder paste onto the exposed surface of each second electroplated layer.

* * * * *